(12) United States Patent
Iza et al.

(10) Patent No.: US 7,575,947 B2
(45) Date of Patent: Aug. 18, 2009

(54) METHOD FOR ENHANCING GROWTH OF SEMI-POLAR (AL,IN,GA,B)N VIA METALORGANIC CHEMICAL VAPOR DEPOSITION

(75) Inventors: Michael Iza, Santa Barbara, CA (US); Troy J. Baker, Santa Barbara, CA (US); Benjamin A. Haskell, Santa Barbara, CA (US); Steven P. DenBaars, Golera, CA (US); Shuji Nakamura, Santa Barbara, CA (US)

(73) Assignees: The Regents of the University of California, Oakland, CA (US); Japan Science and Technology Agency, Kawaguchi, Saitama (JP)

( * ) Notice: Subject to any disclaimer, the term of this patent is extended or adjusted under 35 U.S.C. 154(b) by 265 days.

(21) Appl. No.: 11/517,797

(22) Filed: Sep. 8, 2006

(65) Prior Publication Data

US 2009/0184342 A1 Jul. 23, 2009

Related U.S. Application Data

(60) Provisional application No. 60/715,491, filed on Sep. 9, 2005.

(51) Int. Cl.
*H01L 21/00* (2006.01)
(52) U.S. Cl. .......................... 438/46; 438/36; 438/485; 257/79; 257/103
(58) Field of Classification Search ............... 438/22, 438/36, 41, 44, 46, 48, 481, 485, 680, 681; 257/12, 13, 79, 86, 94, 103
See application file for complete search history.

(56) References Cited

U.S. PATENT DOCUMENTS

| | | | |
|---|---|---|---|
| 4,855,249 A | 8/1989 | Akasaki et al. | |
| 5,741,724 A | 4/1998 | Ramdani et al. | |
| 6,153,010 A | 11/2000 | Kiyoku et al. | |
| 6,316,785 B1 | 11/2001 | Nunoue et al. | |
| 6,599,362 B2 | 7/2003 | Ashby et al. | |
| 6,847,057 B1 | 1/2005 | Gardner et al. | |
| 7,220,324 B2 | 5/2007 | Baker et al. | |
| 2002/0144645 A1 | 10/2002 | Kim et al. | |
| 2003/0024475 A1 | 2/2003 | Anderson | |
| 2004/0251471 A1 | 12/2004 | Dwilinski et al. | |
| 2005/0142391 A1 | 6/2005 | Dmitriev et al. | |
| 2005/0161697 A1 | 7/2005 | Nakahata et al. | |
| 2005/0258451 A1 | 11/2005 | Saxler et al. | |
| 2007/0015345 A1 | 1/2007 | Baker et al. | |
| 2007/0093073 A1 | 4/2007 | Farrell et al. | |

OTHER PUBLICATIONS

Nichizuka, K., Efficient Radiative Recombination From <1122> — oriented in InxGa1-xN Multiple quantum Wells Fabricated by the Regrowth Technique, Applied Physics Letters Oct. 2004, vol. 85, No. 15 pp. 3122-3124, abstract.

(Continued)

*Primary Examiner*—Kevin M Picardat
(74) *Attorney, Agent, or Firm*—Gates & Cooper LLP

(57) ABSTRACT

A method for growing a semi-polar nitride semiconductor thin film via metalorganic chemical vapor deposition (MOCVD) on a substrate, wherein a nitride nucleation or buffer layer is grown on the substrate prior to the growth of the semi-polar nitride semiconductor thin film.

12 Claims, 4 Drawing Sheets

OTHER PUBLICATIONS

Sharma, R., Demonstration of a Semipolar (1013) InGaN/GaN Green Light Emitting Diode, Applied Physics letters Nov. 2005, vol. 87, 23110, pp. 1-3, abstract.

Amano, H. et al., "Metalorganic vapor phase . . . layer," Appl. Phys. Lett., 1986, 48(5):353.

Nakamura, S., "GaN Growth Using GaN Buffer Layer," Jpn. J. Appl. Phys., 1991, 30(10A):L1705-L1707.

Koleske, D.D. et al., "Understanding GaN nucleation . . . sapphire," J. Cryst. Growth, 2004, 273:86-99.

Moran, B. et al., "Structural and morphological evolution . . . layer," J. Cryst. Growth, 2004, 273:38-47.

Haskell, B.A., "Defect reduction in {1 100} . . . epitaxy," Appl. Phys. Lett., 2005, 86, pp. 111917-1-111917-3.

Shao, Y-P. et al., "Electrical Characterization of Semipolar Gallium Nitride Thin Films," NNIN REU Research Accomplishments, Aug. 2005, pp. 132-133.

METHOD FOR ENHANCING GROWTH OF SEMI-POLAR (AL,IN,GA,B)N VIA METALORGANIC CHEMICAL VAPOR DEPOSITION

CROSS-REFERENCE TO RELATED APPLICATIONS

This application claims the benefit under 35 U.S.C. Section 119(e) of the following commonly-assigned U.S. patent application:

U.S. Provisional Patent Application Ser. No. 60/715,491, filed on Sep. 9, 2005, by Michael Iza, Troy J. Baker, Benjamin A. Haskell, Steven P. DenBaars and Shuji Nakamura, entitled "METHOD FOR ENHANCING GROWTH OF SEMI-POLAR (Al,In,Ga,B)N VIA METALORGANIC CHEMICAL VAPOR DEPOSITION,";

which application is incorporated by reference herein.

This application is related to the following co-pending and commonly-assigned applications:

U.S. Utility patent application Ser. No. 11/372,914, filed Mar. 10, 2006, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,", which application claims the benefit under 35 U.S.C. Section 119(e) of U.S. Provisional Patent Application Ser. No. 60/660,283, filed Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,";

U.S. Utility patent application Ser. No. 11/444,946, filed Jun. 1, 2006, by Robert M. Farrell, Jr., Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMI-POLAR (Ga,Al,In,B)N THIN FILMS, HETEROSTRUCTURES, AND DEVICES,", which application claims the benefit under 35 U.S.C. Section 119(e) of U.S. Provisional Patent Application Ser. No. 60/686,244, filed Jun. 1, 2005, by Robert M. Farrell, Jr., Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMI-POLAR (Ga,Al,In,B)N THIN FILMS, HETEROSTRUCTURES, AND DEVICES,";

U.S. Utility patent application Ser. No. 11/486,224, filed Jul. 13, 2006, by Troy J. Baker, Benjamin A. Haskell, James S. Speck, and Shuji Nakamura, entitled "LATERAL GROWTH METHOD FOR DEFECT REDUCTION OF SEMI-POLAR NITRIDE FILMS,", which application claims the benefit under 35 U.S.C. Section 119(e) of U.S. Provisional Patent Application Ser. No. 60/698,749, filed Jul. 13, 2005, by Troy J. Baker, Benjamin A. Haskell, James S. Speck, and Shuji Nakamura, entitled "LATERAL GROWTH METHOD FOR DEFECT REDUCTION OF SEMI-POLAR NITRIDE FILMS,";

U.S. Provisional Patent Application Ser. No. 60/760,739, filed Jan. 20, 2006, by John F. Kaeding, Michael Iza, Troy J. Baker, Hiroshi Sato, Benjamin A. Haskell, James S. Speck, Steven P. DenBaars and Shuji Nakamura, entitled "METHOD FOR IMPROVED GROWTH OF SEMIPOLAR (Al,In,Ga,B)N,";

U.S. Provisional Patent Application Ser. No. 60/760,628, filed Jan. 20, 2006, by Hiroshi Sato, John F. Kaeding, Michael Iza, Troy J. Baker, Benjamin A. Haskell, Steven P. DenBaars and Shuji Nakamura, entitled "METHOD FOR ENHANCING GROWTH OF SEMIPOLAR (Al,In,Ga,B)N VIA METALORGANIC CHEMICAL VAPOR DEPOSITION,";

U.S. Provisional Patent Application Ser. No. 60/772,184, filed Feb. 10, 2006, by John F. Kaeding, Hiroshi Sato, Michael Iza, Hirokuni Asamizu, Hong Zong, Steven P. DenBaars and Shuji Nakamura, entitled "METHOD FOR CONDUCTIVITY CONTROL OF SEMIPOLAR (Al,In,Ga,B) N,";

U.S. Provisional Patent Application Ser. No. 60/774,467, filed Feb. 17, 2006, by Hong Zong, John F. Kaeding, Rajat Sharma, James S. Speck, Steven P. DenBaars and Shuji Nakamura, entitled "METHOD FOR GROWTH OF SEMIPOLAR (Al,In,Ga,B) N OPTOELECTRONICS DEVICES,";

all of which applications are incorporated by reference herein.

BACKGROUND OF THE INVENTION

1. Field of the Invention

The present invention is related to semiconductor materials, methods, and devices, and more particularly, to a method for enhancing growth of semi-polar (Al,In,Ga,B)N via metalorganic chemical vapor deposition.

2. Description of the Related Art (Note: This application references a number of different publications and patents as indicated throughout the specification by one or more reference numbers within brackets, e.g., [Ref. x]. A list of these different publications and patents ordered according to these reference numbers can be found below in the section entitled "References." Each of these publications and patents is incorporated by reference herein.)

The usefulness of gallium nitride (GaN) and its ternary and quaternary compounds incorporating aluminum and indium (AlGaN, InGaN, AlInGaN) has been well established for fabrication of visible and ultraviolet optoelectronic devices and high-power electronic devices. These devices are typically grown epitaxially using growth techniques including molecular beam epitaxy (MBE), metalorganic chemical vapor deposition (MOCVD), and hydride vapor phase epitaxy (HVPE).

GaN and its alloys are most stable in the hexagonal würtzite crystal structure, in which the structure is described by two (or three) equivalent basal plane axes that are rotated 120° with respect to each other (the a-axes), all of which are perpendicular to a unique c-axis. Group III and nitrogen atoms occupy alternating c-planes along the crystal's c-axis. The symmetry elements included in the würtzite structure dictate that III-nitrides possess a bulk spontaneous polarization along this c-axis, and the würtzite structure exhibits piezoelectric polarization.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

One approach to eliminating the spontaneous and piezoelectric polarization effects in GaN optoelectronic devices is to grow the devices on non-polar planes of the crystal. Such planes contain equal numbers of Ga and N atoms and are charge-neutral. Furthermore, subsequent non-polar layers are crystallographically equivalent to one another so the crystal will not be polarized along the growth direction. Two such families of symmetry-equivalent non-polar planes in GaN are the $\{11\bar{2}0\}$ family, known collectively as a-planes, and the $\{1\bar{1}00\}$ family, known collectively as m-planes. Unfortunately, despite advances made by researchers at the University of California, the assignee of the present invention, growth of non-polar nitrides remains challenging and has not yet been widely adopted in the III-nitride industry.

Another approach to reducing or possibly eliminating the polarization effects in GaN optoelectronic devices is to grow the devices on semi-polar planes of the crystal. The term semi-polar planes can be used to refer to a wide variety of planes that possess two nonzero h, i, or k Miller indices, and a nonzero l Miller index. Some commonly observed examples of semi-polar planes in c-plane GaN heteroepitaxy include the $\{11\bar{2}2\}$, $\{10\bar{1}1\}$, and $\{10\bar{1}3\}$ planes, which are found in the facets of pits. These planes also happen to be the same planes that the inventors have grown in the form of planar films. Other examples of semi-polar planes in the würtzite crystal structure include, but are not limited to, $\{10\bar{1}2\}$, $\{20\bar{2}1\}$, and $\{10\bar{1}4\}$. The nitride crystal's polarization vector lies neither within such planes or normal to such planes, but rather lies at some angle inclined relative to the plane's surface normal. For example, the $\{10\bar{1}1\}$ and $\{10\bar{1}3\}$ planes are at 62.98° and 32.06° to the c-plane, respectively.

In addition to spontaneous polarization, the second form of polarization present in nitrides is piezoelectric polarization. This occurs when the material experiences a compressive or tensile strain, as can occur when (Al, In, Ga, B)N layers of dissimilar composition (and therefore different lattice constants) are grown in a nitride heterostructure. For example, a thin AlGaN layer on a GaN template will have in-plane tensile strain, and a thin InGaN layer on a GaN template will have in-plane compressive strain, both due to lattice matching to the GaN. Therefore, for an InGaN quantum well on GaN, the piezoelectric polarization will point in the opposite direction than that of the spontaneous polarization of the InGaN and GaN. For an AlGaN layer latticed matched to GaN, the piezoelectric polarization will point in the same direction as that of the spontaneous polarization of the AlGaN and GaN.

The advantage of using semi-polar planes over c-plane nitrides is that the total polarization will be reduced. There may even be zero polarization for specific alloy compositions on specific planes. Such scenarios will be discussed in detail in future scientific papers. The important point is that the polarization will be reduced compared to that of c-plane nitride structures.

Bulk crystals of GaN are not readily available, so it is not possible to simply cut a crystal to present a surface for subsequent device regrowth. Commonly, GaN films are initially grown heteroepitaxially, i.e., on foreign substrates that provide a reasonable lattice match to GaN.

Semi-polar GaN planes have been demonstrated on the sidewalls of patterned c-plane oriented stripes. Nishizuka et al. [Ref. 1] have grown $\{11\bar{2}2\}$ InGaN quantum wells by this technique. They have also demonstrated that the internal quantum efficiency of the semi-polar plane $\{11\bar{2}2\}$ is higher than that of the c-plane, which results from the reduced polarization.

However, this method of producing semi-polar planes is drastically different than that of the current invention; it is an artifact of the epitaxial lateral overgrowth (ELO) technique. ELO is a cumbersome processing and growth method used to reduce defects in GaN and other semiconductors. It involves patterning stripes of a mask material, often $SiO_2$ for GaN. The GaN is then grown from open windows between the mask and then grown over the mask. To form a continuous film, the GaN is then coalesced by lateral growth. The facets of these stripes can be controlled by the growth parameters. If the growth is stopped before the stripes coalesce, then a small area of semi-polar plane can be exposed. This area may be 10 μm wide at best. The semi-polar plane will be not parallel to the substrate surface. This available surface area is too small to process it into a semi-polar LED. Furthermore, forming device structures on inclined facets is significantly more difficult than forming those structures on normal planes. Also, not all nitride compositions are compatible with ELO processes; as such, only ELO of GaN is widely practiced.

Nucleation, buffer, and/or wetting layers have been extensively used in the growth of high quality nitrides since the early 1990s [Refs. 2, 3]. This technique typically employs the use of a thin layer (50 Å-2000 Å) of polycrystalline and/or amorphous nitride semiconductor material prior to the deposition of thicker (1 μm-5 μm) nitride semiconductor material. While the advantages of using nucleation layers (NLs) in heteroepitaxy of c-plane GaN thin films is well established, the mechanisms for how the NLs improve crystal quality are not well understood. It is believed that NLs provide crystal sites onto which high quality nitride materials then deposit [Refs. 4, 5]. The later deposition shows a dramatic improvement in crystal, electrical, and optical properties compared to nitrides deposited without a NL.

Although the use of NLs has been extensively documented for nitride thin films, they comprise of nitrides grown only in the (0001) or c-plane crystallographic direction [Refs. 6, 7]. Ramdani et al. [Ref. 7] demonstrated the use of a plurality of buffer layers in order to improve the crystal quality of c-plane GaN grown on a spinel substrate. This method is considerably different from the present invention in that the author is describing the growth of c-plane GaN, which has a 9% lattice mismatch to (111) spinel, as described in [Ref. 7]. It is also very cumbersome due to the plurality of buffer layers, four in total, needed to produce device quality c-plane GaN. In contrast, the current invention describes the use of a single buffer layer for the improvement of semi-polar GaN.

Improvement of c-plane GaN films has also been demonstrated by Akasaki et al. [Ref. 6]. As discussed earlier, optoelectronic and electronic devices in this particular crystallographic direction suffer from the undesirable QCSE, due to the existence of strong piezoelectric and spontaneous polarizations. The present invention distinguishes itself from the above-mentioned methods by the use of a single buffer layer in order to improve the quality of semi-polar nitride thin films.

There is a need, then for improved methods for the growth of planar films of semi-polar nitrides, in which a large area of (Al,In,Ga,B)N is parallel to the substrate surface. The present invention satisfies this need.

SUMMARY OF THE INVENTION

The present invention describes a method allowing for the growth of planar films of semi-polar nitrides, in which a large area of (Al,In,Ga,B)N is parallel to the substrate surface.

Specifically, the present invention discloses a method for growing a semi-polar nitride semiconductor thin film via metalorganic chemical vapor deposition (MOCVD) on a substrate, wherein a nitride nucleation or buffer layer is grown on the substrate prior to the growth of the semi-polar nitride semiconductor thin film. The method may further comprise nitridizing the substrate prior to growing the nucleation or buffer layer.

The nucleation or buffer layer may comprise $Al_xIn_yGa_{1-x-y}N$ with x=1 and y=0.

The semi-polar nitride semiconductor thin film may comprise multiple layers having varying or graded compositions, a heterostructure containing layers of dissimilar (Al,Ga,In,B)N composition, one or more layers of dissimilar (Al,Ga,In,B)N composition. The semi-polar nitride semiconductor thin film may be doped, with elements such as Fe, Si, and Mg.

A growth surface of the semi-polar nitride semiconductor thin film is parallel to the substrate surface and the growth surface is greater than a 10 micrometer wide area. For example, the semi-polar nitride semi-conductor thin film may be grown to cover a 2 inch diameter substrate.

The semi-polar nitride semiconductor thin film may be used as a substrate for subsequent growth, such as that by hydride vapor phase epitaxy (HVPE), metalorganic chemical vapor deposition (MOCVD), and/or molecular beam epitaxy (MBE). The semi-polar nitride semiconductor thin film has improved surface and crystal features needed for state-of-the-art nitride semi-polar electronic devices.

A device may be fabricated using the method.

BRIEF DESCRIPTION OF THE DRAWINGS

Referring now to the drawings in which like reference numbers represent corresponding parts throughout:

In FIG. 2(a), the GaN is grown on an $Al_xIn_yGa_{1-x-y}N$ nucleation layer with x=0 and y=0, while in FIG. 2(b), the GaN is grown on an $Al_xIn_yGa_{1-x-y}N$ nucleation layer with x=1 and y=0.

In FIG. 3(a), the GaN is grown without a nucleation layer by HVPE, while in FIG. 3(b), the GaN is grown on an $Al_xIn_yGa_{1-x-y}N$ nucleation layer with x=1 and y=0 by MOCVD.

DETAILED DESCRIPTION OF THE INVENTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

The present invention describes a method for growing device-quality semi-polar planar {10$\bar{1}$1} nitride semiconductor thin films via MOCVD on {100} $MgAl_2O_4$ (spinel) substrates miscut in the <011> direction. Growth of semi-polar nitride semiconductors, for example, {10$\bar{1}$1} and {10$\bar{1}$3} of GaN, offers a means of reducing polarization effects in würtzite-structure III-nitride device structures. The term nitrides refers to any alloy composition of the (Ga,Al,In,B)N semiconductors having the formula $Ga_nAl_xIn_yB_zN$, where $0 \leq n \leq 1, 0 \leq x \leq 1, 0 \leq y \leq 1, 0 \leq z \leq 1$, and n+x+y+z=1.

Current nitride devices are grown in the polar [0001] c-direction, which results in charge separation along the primary conduction direction in vertical devices. The resulting polarization fields are detrimental to the performance of current state of the art optoelectronic devices. Growth of these devices along a semi-polar direction could improve device performance significantly by reducing built-in electric fields along the conduction direction. The present invention provides a means of enhancing obtainable {10$\bar{1}$1} III-nitride film quality when grown by metalorganic chemical vapor deposition.

Technical Description

The present invention is a method to enhance the growth of semi-polar nitride films by use of a buffer layer or nucleation layer. Examples of this are {10$\bar{1}$1} GaN films. In this embodiment, a {100} $MgAl_2O_4$ spinel substrate miscut in the <011> direction is used for the growth process. In order to obtain planar semi-polar GaN, it is critical to use an $Al_xIn_yGa_{1-x-1}N$ nucleation layer with high aluminum composition prior to GaN growth.

These films were grown using a commercially available MOCVD system. A general outline of growth parameters for {10$\bar{1}$1} GaN is a pressure between 10 torr and 1000 torr, and a temperature between 400° C. and 1400° C. This variation in pressure and temperature is indicative of the stability of the growth of semi-polar GaN using a suitable substrate. The epitaxial relationships and conditions should hold true regardless of the type of reactor. However, the reactor conditions for growing these planes will vary according to individual reactors and growth methods (HVPE, MOCVD, and MBE, for example).

Process Steps

Figure 1:
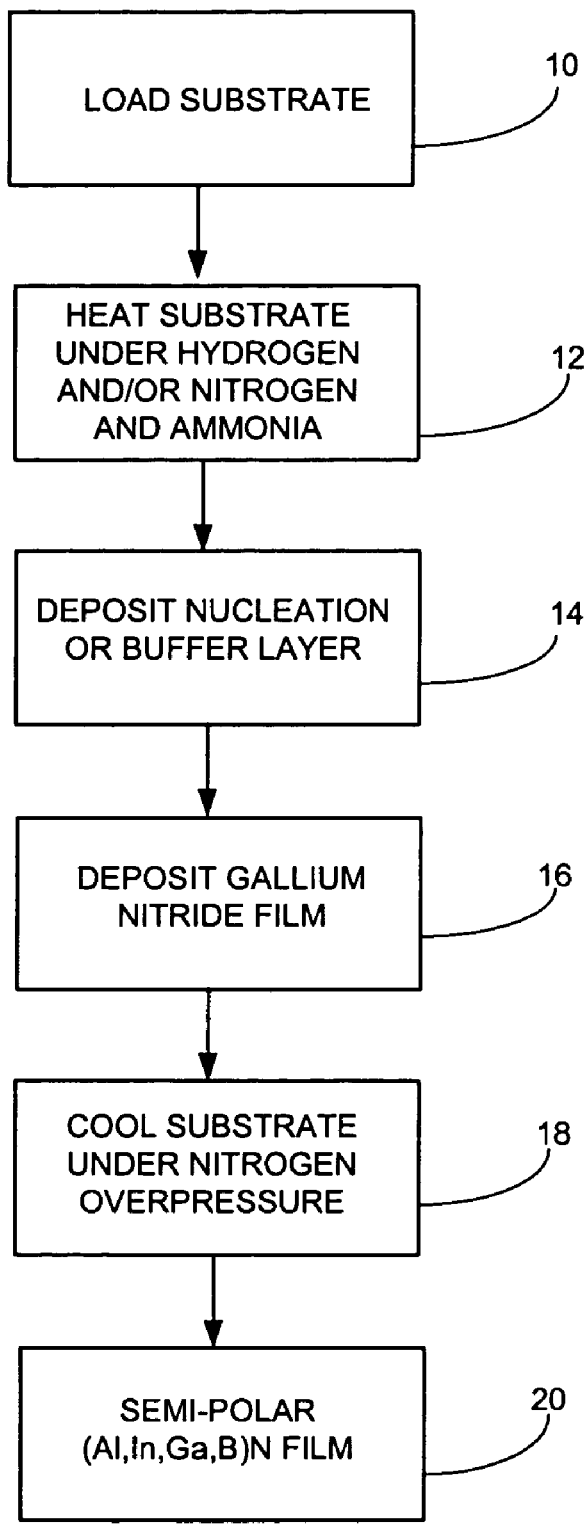
FIG. 1 is a flowchart of the preferred embodiment of the present invention.

FIG. 1 is a flowchart that illustrates the steps of the MOCVD process for the growth of semi-polar gallium nitride (GaN) thin films on a spinel substrate, according to the preferred embodiment of the present invention that is described in the following paragraphs.

Block 10 represents the step of loading a substrate into an MOCVD reactor. For the growth of {10$\bar{1}$1} GaN, a (100) spinel substrate is used with a miscut in the <011> direction.

Block 12 represents the step of heating the substrate. The reactor's heater is turned on and ramped to a set point temperature of 1150° C. under conditions to encourage nitridization of the surface of the substrate. Generally, nitrogen and/or hydrogen and/or ammonia flow over the substrate at atmospheric pressure.

Block 14 represents the step of depositing/growing a single nucleation or buffer layer on the substrate. Once the set point temperature is reached, the ammonia flow is set to 0.1 to 3.0 slpm. After 1 to 20 minutes, the reactor's set point temperature is then increased to 1190° C., the reactor's pressure is reduced to 76 torr, and 0 to 3 sccm of trimethylgallium (TMGa) and/or 20 sccm of trimethylaluminum (TMAl) and/or 120 sccm of trimethylindium (TMIn) are introduced into the reactor to initiate the $Al_xIn_yGa_{1-x-y}N$ nucleation or buffer layer growth on the substrate. After 1-40 minutes, the $Al_xIn_yGa_{1-x-y}N$ nucleation or buffer layer reaches the desired thickness. The values of x and y in the $Al_xIn_yGa_{1-x-y}N$ nucleation or buffer layer are in the range $0 \leq x \leq 1, 0 \leq y \leq 1$. Typical thicknesses for the nucleation or buffer layer are in the range 20 nm to 600 nm, with an optimal thickness of ~200 nm.

Block 16 represents the step of depositing/growing semi-polar GaN film. At this point, the TMAl flow is shut off and TMGa is increased to 9.5 sccm for approximately 1 to 4 hours of GaN growth.

Block 18 represents the step of cooling the substrate. Once the desired GaN thickness is achieved, TMGa flow is interrupted and the reactor is cooled down while flowing ammonia or nitrogen to preserve the GaN film.

Block 20 shows the end result is a semi-polar (Al,In,Ga,B)N film. This semi-polar nitride semiconductor thin film may be used as a substrate for subsequent growth, such as that by hydride vapor phase epitaxy (HVPE), metalorganic chemical vapor deposition (MOCVD), and/or molecular beam epitaxy (MBE).

A device may be fabricated using the method of FIG. 1.

Possible Modifications and Variations on the Preferred Embodiment

The scope of the invention covers more than just the particular example cited. The method represented by FIG. 1 is pertinent to all semi-conductor nitrides on any semi-polar plane. For example, in Block 16, one could grow $\{10\bar{1}1\}$ AlN, InN, AlGaN, InGaN, or AlInN on a miscut (100) spinel substrate. Another example is that, in Block 16, one could grow $\{10\bar{1}2\}$ nitrides, if the proper substrate such as $\{10\bar{1}4\}$ 4H-SiC is used, or one could grow semi-polar planar $\{11\bar{2}2\}$ on a miscut m-plane $Al_2O_3$ substrate. These examples and other possibilities still incur all of the benefits of planar semi-polar films. The method of FIG. 1 covers any growth technique that generates a semiconductor semi-polar nitride film by using a nitride buffer or nucleation layer of Block 14.

The reactor conditions will vary by reactor type and design. The growth described above in FIG. 1 is only a description of one set of conditions that has been found to be useful conditions for the growth of semi-polar GaN. It has also been discovered that these films will grow under a wide parameter space of pressure, temperature, gas flows, etc., all of which will generate planar semi-polar nitride film.

There are other steps that could vary in the growth process of FIG. 1. It has been found that nitridizing the substrate improves surface morphology for some films, and determines the actual plane grown for other films. However, this may or may not be necessary for any particular growth technique.

The growth described above in FIG. 1 comprises the growth of a GaN film on an AlInGaN nucleation layer. However, any semi-polar nitride semi-conductor thin film can be grown in block 16 upon a nucleation layer of block 14. The semi-polar nitride semiconductor thin film may be comprised of multiple layers having varying or graded compositions. The majority of nitride devices comprise heterostructures containing layers of dissimilar (Al,Ga,In,B)N composition. The method of FIG. 1 can be used for the growth, during Block 16, of any nitride alloy composition and any number of layers or combination thereof. For example, the semi-polar nitride semiconductor thin film may contain one or more layers of dissimilar (Al,Ga,In,B)N composition. Dopants, such as Fe, Si, and Mg, are frequently incorporated into nitride layers of Block 16. The incorporation of these and other dopants not specifically listed is compatible with the practice of this invention.

Advantages and Improvements

The existing practice is to grow GaN with the c-plane normal to the surface. This plane has a spontaneous polarization and piezoelectric polarization which are detrimental to device performance. The advantage of semi-polar over c-plane nitride films is the reduction in polarization and the associated increase in internal quantum efficiency for certain devices.

Non-polar planes could be used to completely eliminate polarization effects in devices. However, these planes are quite difficult to grow, thus non-polar nitride devices are not currently in production. The advantage of semi-polar over non-polar nitride films is the ease of growth. It has been found that semi-polar planes have a large parameter space in which they will grow. For example, non-polar planes will not grow at atmospheric pressure, but semi-polar planes have been experimentally demonstrated to grow from 62.5 torr to 760 torr, but probably have an even wider range than that.

The advantage of planar semi-polar films grown using the method of FIG. 1 over ELO sidewall is the large surface area that can be processed into an LED or other device. Another advantage is that the growth surface using the method of FIG. 1 is parallel to the substrate surface, unlike that of ELO sidewall semi-polar planes. For example, samples are often grown to cover 2 inch diameter substrates compared to the few micrometer wide areas (at most 10 micrometers wide) previously demonstrated for the growth of semi-polar nitrides.

Figure 2A:
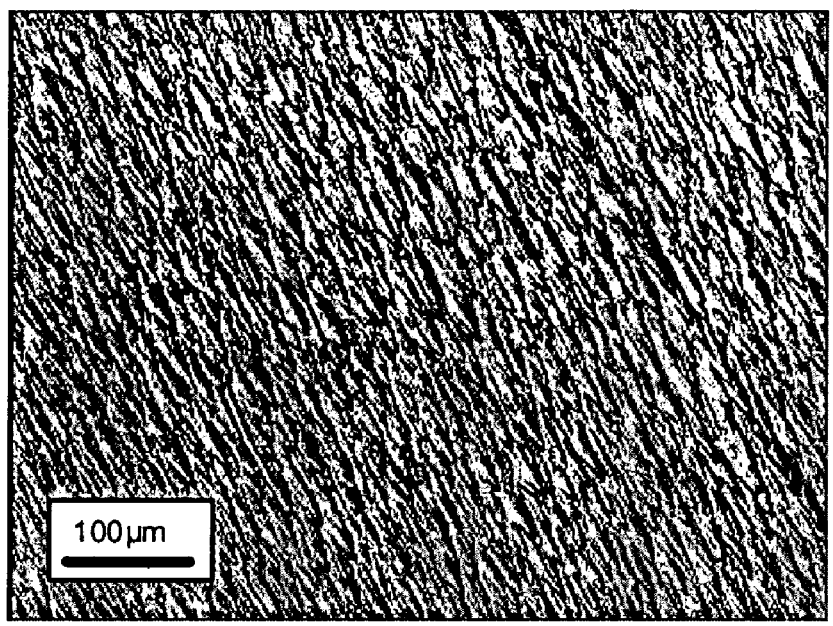
FIGS. 2(a) and 2(b) are micrographs of the surface of GaN grown on {100} spinel.
Figure 2B:
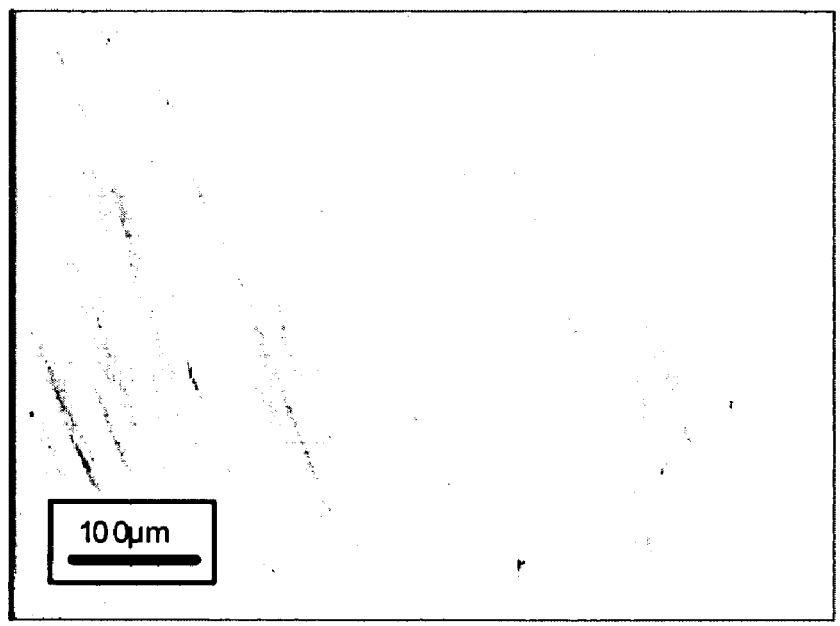

The use of an $Al_xIn_yGa_{1-x-y}N$ nucleation layer with high aluminium composition such as x=1 and y=0, formed in Block 14 of FIG. 1, prior to GaN growth in Block 16, has been shown to dramatically improve the crystal quality of semi-polar GaN thin films. This is apparent in the optical micrographs of FIG. 2(a) and FIG. 2(b). These optical micrographs show a striking improvement in the surface quality and film crystal quality by incorporating the buffer layer technique described in the preferred embodiment. With the use of an $Al_xIn_yGa_{1-x-y}N$ nucleation layer with x=0 and y=0 (FIG. 2(a)), the GaN film growth is essentially polycrystalline and there is no single crystal growth orientation. Thus, the film has large numbers of small GaN crystals oriented in various directions. Films of this quality can not be used for the fabrication of electronic devices. On the other hand, the use of an $Al_xIn_yGa_{1-x-y}N$ nucleation layer with x=1 and y=0, (FIG. 2(b)), shows a substantial improvement in crystal quality. Semi-polar GaN thin films using an $Al_xIn_yGa_{1-x-y}N$ buffer layer with x=1 and y=0 possess the necessary surface and crystal features needed for state-of-the-art nitride semi-polar electronic devices. These features are: a planar crystal surface, small surface undulations and, a small number of crystallographic defects present in the film.

Figure 3A:
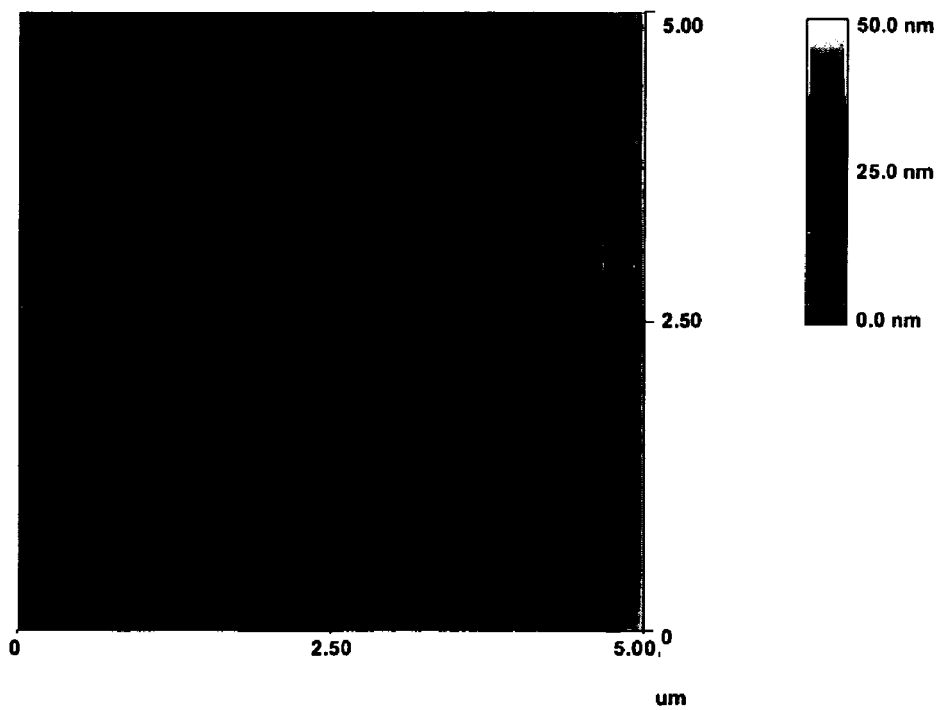
FIGS. 3(a) and 3(b) are atomic force microscopy (AFM) images of the surface of GaN grown on {100} spinel.
Figure 3B:
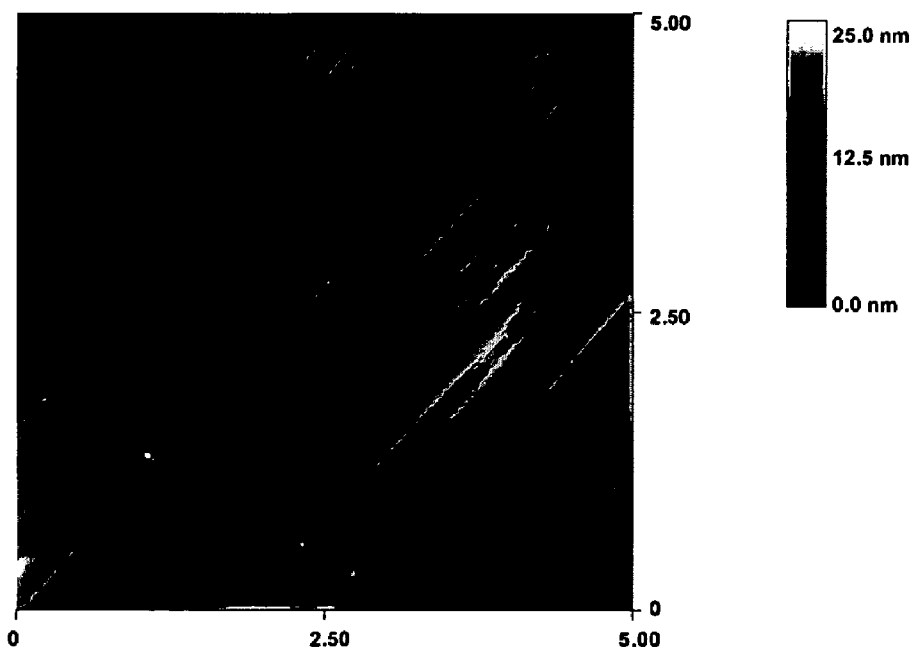

Atomic force microscopy (AFM) images of the GaN film with no nucleation layer grown by HVPE and with an $Al_xIn_yGa_{1-x-y}N$ nucleation layer with x=1 and y=0 grown by MOCVD are shown in FIG. 3(a) and FIG. 3(b), respectively (please note the different scale sizes to the right of each AFM image). Typical image Root Mean Square (RMS) values, which give an indication of the nano-scale surface roughness of a thin film, for a 5×5 μm square area of HVPE grown $\{10\bar{1}1\}$ GaN films are on the order of 7 nm. On the other hand, the typical values for GaN films grown with an $Al_xIn_yGa_{1-x-y}N$ buffer layer with x=1 and y=0 by MOCVD for a 5×5 μm area are on the order 4 nm. This indicates that the films grown by using an $Al_xIn_yGa_{1-x-y}N$ buffer layer with x=1 and y=0 by MOCVD as described in the preferred embodiment of this invention show an improved surface quality which is necessary in the fabrication of high-quality semiconductor nitride devices.

Figure 4:
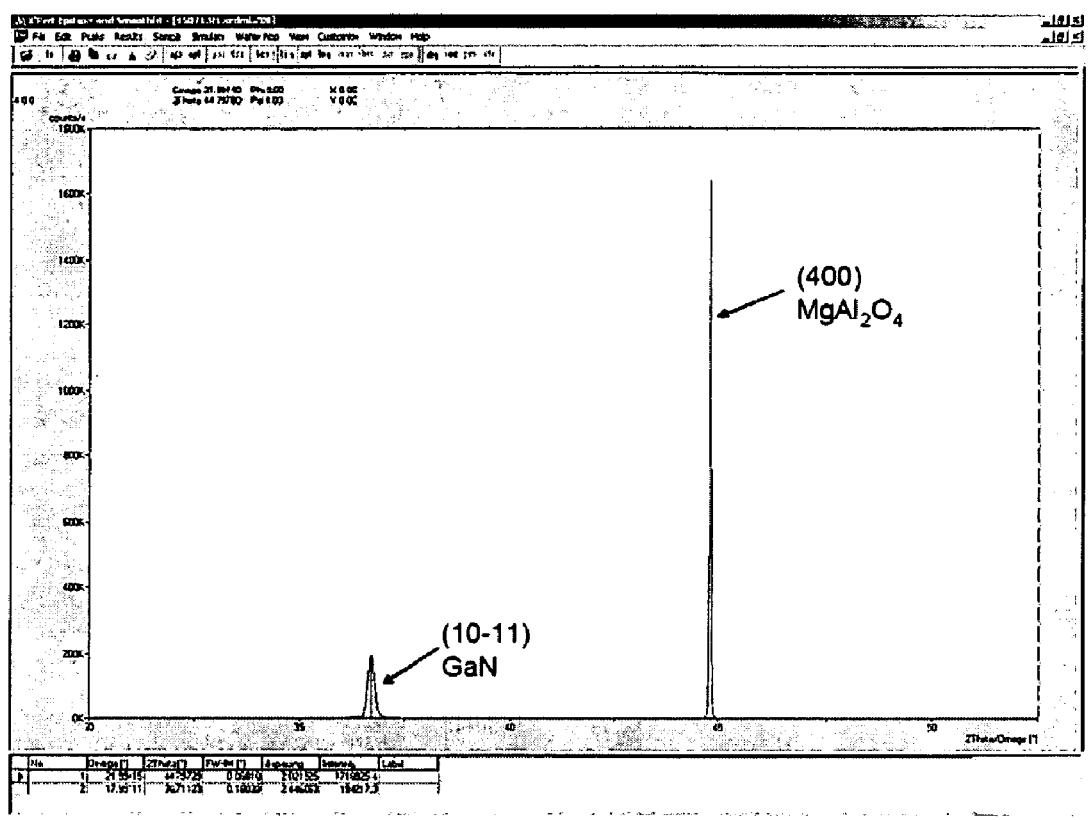
FIG. 4 is an omega-2θ (400) x-ray diffraction (XRD) scan of semi-polar GaN films grown with an $Al_xIn_yGa_{1-x-y}N$ nucleation layer with x=1 and y=0 by MOCVD.

FIG. 4 shows the x-ray diffraction (XRD) of the ω-2θ scan for on-axis reflections. This scan verifies that the film grown using an $Al_xIn_yGa_{1-x-y}N$ nucleation layer with x=1 and y=0 by MOCVD, as described in the preferred embodiment of this invention, is, in fact, $\{10\bar{1}1\}$ semi-polar GaN. XRD ω scans of the GaN $\{10\bar{1}1\}$ rocking towards the [0002] or c-axis were performed in order to assess the GaN microstructure quality of the films. The Full-Width-Half-Maximum (FWHM), which is an indicator of thin film microstructure quality, for the GaN $\{10\bar{1}1\}$ rocking towards the [0002] for HVPE grown GaN with no buffer layer is typically 0.7 degrees. On the other hand, the value for $\{10\bar{1}1\}$ GaN using an $Al_xIn_yGa_{1-x-y}N$ nucleation layer with x=1 and y=0 by MOCVD is 0.47 degrees. These values indicate a substantial improvement in the microstructure properties of the semi-polar film grown using an $Al_xIn_yGa_{1-x-y}N$ nucleation layer with x=1 and y=0 by MOCVD as described in the preferred embodiment of this invention.

REFERENCES

The following publications are incorporated by reference herein:
[1] Nishizuka, K., Applied Physics Letters, Vol. 85 Number 15, 11 Oct. 2004. This paper is a study of {11$\bar{2}$2} GaN sidewalls of ELO material.
[2] H. Amano, N. Sawaki, I. Akasaki and Y. Toyoda, Applied Physics Letters Vol. 48 (1986) pp. 353. This paper describes the use of an AlN buffer layer for improvement of c-plane GaN crystal quality.
[3] S. Nakamura, Japanese Journal of Applied Physics Vol. 30, No. 10A, October, 1991, pp. L1705-L1707. This paper describes the use of a GaN buffer layer for improvement of c-plane GaN crystal quality.
[4] D. D. Koleske, M. E. Coltrin, K. C. Cross, C. C. Mitchell, A. A. Allerman, Journal of Crystal Growth Vol. 273 (2004) pp. 86-99. This paper describes the effects of GaN buffer layer morphology evolution of c-plane GaN on a sapphire substrate.
[5] B. Moran, F. Wu, A. E. Romanov, U. K. Mishra, S. P. Denbaars, J. S. Speck, Journal of Crystal Growth Vol. 273 (2004) pp. 38-47. This paper describes the effects of AlN buffer layer morphology evolution of c-plane GaN on a silicon carbide substrate.
[6] U.S. Pat. No. 4,855,249, issued Aug. 8, 1989, to Akasaki et al., entitled Process for growing III-V compound semiconductors on sapphire using a buffer layer.
[7] U.S. Pat. No. 5,741,724, issued Apr. 21, 1998, to Ramdani et al., entitled Method of growing gallium nitride on a spinel substrate.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, without fundamentally deviating from the essence of the present invention. It is intended that the scope of the invention be limited not by this detailed description, but rather by the claims appended hereto.

What is claimed is:

1. A method for growing a semi-polar nitride semiconductor film via metalorganic chemical vapor deposition (MOCVD) on a substrate, comprising:
   (a) growing a nitride nucleation or buffer layer on a substrate; and
   (b) growing a semi-polar nitride semiconductor film on the nitride nucleation or buffer layer, wherein a growth surface of the semi-polar nitride semiconductor film is parallel to the substrate's surface.

2. The method of claim 1, wherein the nitride nucleation or buffer layer comprises $Al_xIn_yGa_{1-x-y}N$ with x=1 and y=0.

3. The method of claim 1, wherein the semi-polar nitride semiconductor film comprises multiple layers having varying or graded compositions.

4. The method of claim 1, wherein the semi-polar nitride semiconductor film contains one or more layers of dissimilar (Al,Ga,In,B)N composition.

5. The method of claim 1, wherein the semi-polar nitride semiconductor film comprises a heterostructure containing layers of dissimilar (Al,Ga,In,B)N composition.

6. The method of claim 1, wherein the semi-polar nitride semiconductor film is doped with elements consisting essentially of Fe, Si, and Mg.

7. The method of claim 1, wherein the growth surface is greater than a 10 micrometer wide area.

8. The method of claim 1, wherein the semi-polar nitride semi-conductor film is grown to cover a 2 inch diameter substrate.

9. The method of claim 1, further comprising nitridizing the substrate prior to growing the nucleation or buffer layer.

10. The method of claim 1, wherein the semi-polar nitride semiconductor film is used as a template or substrate for subsequent growth, by hydride vapor phase epitaxy (HVPE), metalorganic chemical vapor deposition (MOCVD), or molecular beam epitaxy (MBE).

11. A device fabricated using the method of claim 1.

12. The method of claim 1, wherein a surface roughness of the semi-polar nitride semiconductor film is less than 7 nm.

\* \* \* \* \*

UNITED STATES PATENT AND TRADEMARK OFFICE
CERTIFICATE OF CORRECTION

PATENT NO. : 7,575,947 B2  Page 1 of 1
APPLICATION NO. : 11/517797
DATED : August 18, 2009
INVENTOR(S) : Iza et al.

It is certified that error appears in the above-identified patent and that said Letters Patent is hereby corrected as shown below:

Title Page, Item (75) Inventors, Steven P. DenBaars, please delete "Golera" and insert --Goleta--.

Signed and Sealed this

Twelfth Day of October, 2010

David J. Kappos
*Director of the United States Patent and Trademark Office*